(12) United States Patent
Urano et al.

(10) Patent No.: US 7,800,124 B2
(45) Date of Patent: Sep. 21, 2010

(54) LIGHT-EMITTING DEVICE

(75) Inventors: Youji Urano, Ikeda (JP); Takuya Nakatani, Hirakata (JP); Yasuhiro Hidaka, Hirakata (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 56 days.

(21) Appl. No.: 11/993,956

(22) PCT Filed: Jun. 30, 2006

(86) PCT No.: PCT/JP2006/313118

§ 371 (c)(1), (2), (4) Date: Dec. 26, 2007

(87) PCT Pub. No.: WO2007/004572

PCT Pub. Date: Jan. 11, 2007

(65) Prior Publication Data

US 2009/0026485 A1    Jan. 29, 2009

(30) Foreign Application Priority Data

Jun. 30, 2005    (JP) .............................. 2005-192648

(51) Int. Cl.
    *H01L 33/00* (2010.01)
(52) U.S. Cl. .................. 257/98; 257/99; 257/E33.058; 257/E33.059; 362/293; 362/311.02; 362/311.03; 362/311.06
(58) Field of Classification Search .......... 257/E33.056, 257/E33.057, E33.058, E33.075, 709, 717; 362/293, 311.01, 311.02, 311.03, 311.06, 362/311.07, 311.1

See application file for complete search history.

(56) References Cited

U.S. PATENT DOCUMENTS

| | | | | |
|---|---|---|---|---|
| 5,739,554 A | * | 4/1998 | Edmond et al. | 257/103 |
| 5,857,767 A | * | 1/1999 | Hochstein | 362/294 |
| 6,498,355 B1 | * | 12/2002 | Harrah et al. | 257/99 |
| 6,833,617 B2 | * | 12/2004 | Kondo et al. | 257/707 |
| 6,936,855 B1 | * | 8/2005 | Harrah | 257/88 |

(Continued)

FOREIGN PATENT DOCUMENTS

JP    63-302076 A    12/1988

(Continued)

OTHER PUBLICATIONS

International Search Report for PCT/JP2006/313118 mailed Jul. 25, 2006.

(Continued)

*Primary Examiner*—David Vu
*Assistant Examiner*—Earl N Taylor
(74) *Attorney, Agent, or Firm*—Cheng Law Group, PLLC

(57) ABSTRACT

A light-emitting device of the present invention includes: a LED chip 10; a chip mounting member 70 having a conductive plate (heat transfer plate) 71 one surface side of which the LED chip 10 is mounted on and a conductor patterns 73, 73 which is formed on the one surface side of the conductive plate 71 through an insulating part 72 and electrically connected to the LED chip 10; and a sheet-shaped connecting member 80 disposed on the other surface side of the conductive plate 71 to connect the conductive plate 71 to a body of the luminaire 90 which is a metal member for holding the chip mounting member 70. The connecting member 80 is made of a resin sheet which includes a filler and whose viscosity is reduced by heating, and the connecting member 80 has an electrical insulating property and thermally connects the conductive plate 71 and the body 90 of the luminaire to each other.

4 Claims, 11 Drawing Sheets

U.S. PATENT DOCUMENTS

| | | |
|---|---|---|
| 2002/0123164 A1* | 9/2002 | Slater et al. .................. 438/39 |
| 2003/0189830 A1* | 10/2003 | Sugimoto et al. ........... 362/294 |
| 2005/0062060 A1* | 3/2005 | Nagai et al. .................. 257/100 |
| 2006/0043401 A1* | 3/2006 | Lee et al. ..................... 257/99 |

FOREIGN PATENT DOCUMENTS

| | | |
|---|---|---|
| JP | 03-061556 A | 3/1991 |
| JP | 11-307875 A | 11/1999 |
| JP | 2002-356006 A | 12/2002 |
| JP | 2003-059332 A | 2/2003 |
| JP | 2003-168829 A | 6/2003 |
| JP | 2005-045054 A | 2/2005 |
| JP | 2005-72382 A | 3/2005 |
| JP | 2005-109282 A | 4/2005 |
| JP | 2005-136224 A | 5/2005 |
| JP | 2005-159045 A | 6/2005 |
| JP | 2005-159265 A | 6/2005 |

OTHER PUBLICATIONS

Notification of Reasons for Refusal for the Application No. 2006-182469 from Japan Patent Office mailed Jan. 23, 2007.

Notification of Reasons for Refusal for the Application No. 2006-182469 from Japan Patent Office mailed Nov. 25, 2008.

* cited by examiner

LIGHT-EMITTING DEVICE

TECHNICAL FIELD

The present invention relates to a light-emitting device.

BACKGROUND ART

Conventionally, light-emitting devices which emits light having a different color from the emission color of a LED chip by combining the LED chip and a phosphor (e.g., fluorescent pigment and fluorescence dye) as a wavelength converting material which emits light having an emission color different from that of the LED chip when excited by the light emitted by the LED chip have been researched and developed at various places. Such light-emitting devices include a commercialized white light-emitting device (which is generally called a white LED) in which an LED chip for emitting blue light or ultraviolet light is combined with a phosphor to produce a white light (emission spectrum of white light).

Also, the application of white LEDs to a luminaire has become an active area for research and development in accordance with recent high output of white LEDs, but when the white LED is applied to an application which requires a relatively high light output such as general illumination, a desired light output cannot be produced by only one white LED. So, generally, a plurality of white LEDs are mounted on one circuit board to form an LED unit (light-emitting device), and the LED unit ensures the desired light output as a whole (for example, see Japanese Patent Application Laid-Open No. 2003-59332 (hereinafter, referred to as Patent Document 1)).

Also, conventionally, in the light-emitting device having an LED chip and a circuit board on which the LED chip is mounted, a structure for effectively dissipating heat generated in a light-emitting part of the LED chip to the outside has been proposed so as to increase the power of the light output by constraining a rise of a junction temperature of the LED chip and increasing the input power (for example, see Japanese Patent Application Laid-Open No. 2003-168829 (hereinafter, referred to as Patent Document 2), Paragraph [0030] and FIG. 6).

In the light-emitting device disclosed in Patent Document 2, as shown in FIG. 12, a metal substrate in which a conductor pattern 203 is formed via an insulating resin layer 202 on a metal plate 201 is adopted as a circuit board 200 on which LED chips 10' are mounted, so that the heat generated at each of the LED chips 10' can be transferred to the metal plate 201 through a heat transfer member 210. In this case, each of the LED chips 10' is a GaN-based blue LED chip in which a light-emitting part made of a GaN-based compound semiconductor material is formed on one surface side of a substrate for crystal growth formed from a sapphire substrate which is an insulator, and each LED chip 10' is mounted on the circuit board 200 by flip chip, and the other surface of the substrate for crystal growth is a light output surface.

When the light-emitting device having a configuration shown in FIG. 12 is applied to a luminaire, in order to efficiently dissipate heat generated in the light-emitting device, it is conceivable that the body of the luminaire for holding the circuit board 200 on which the LED chips 10' are mounted is made of a metal, and the metal plate 201 of the circuit board 200 of the light-emitting device is thermally connected to the metal body of the luminaire. However, in order to ensure a lighting surge protection, it is necessary to interpose a heat radiation sheet having a rubber sheet shape, such as Sarcon (registered trademark), as a sheet-shaped insulating layer, between the body of the luminaire and the metal plate 201 of the circuit board 200, so the heat resistance from the light-emitting part of each LED chip 10' to the body of the luminaire, which is the metal member, for holding the light-emitting device is increased. Therefore, it is necessary to limit the input power to each LED chip 10' to prevent the junction temperature of each LED chip 10' from rising above the maximum junction temperature, so it is difficult to increase the power of the light output.

In addition, when the above-mentioned heat radiation sheet is interposed between the metal plate 201 and the body of the luminaire, the heat radiation sheet may cause lack of adhesion between the metal plate 201 and the heat radiation sheet, which may lead to an increased heat resistance due to air spaces generated between the sheet and the plate, or which may lead to various heat resistances between each of the light-emitting devices and the body of the luminaire.

Furthermore, in the light-emitting device disclosed in Patent Document 2, since the heat generated in the light-emitting part of the LED chip 10' is transferred to the metal plate 201 via the heat transfer member 210 having a size smaller than that of the LED chip 10', the heat resistance from the LED chip 10' to the metal plate 201 is relatively high. Therefore, when the sapphire substrate, that is the substrate for crystal growth, is mounted on the metal plate 201 to be thermally connected, there is a problem that the heat resistance of the sapphire substrate is increased.

DISCLOSURE OF THE INVENTION

The present invention was made in view of above situation, and the object of the present invention is to provide a light-emitting device which can constrain an increase in temperature of an LED chip and can increase a power of the light output.

A light-emitting device of the present invention includes: an LED chip, a chip mounting member, and a sheet-shaped connecting member. The chip mounting member has a heat transfer plate and a conductor pattern. The heat transfer plate is made of a heat conductive material and one surface side of which the LED chip is mounted on. The conductor pattern is formed on the one surface side of the heat transfer plate through an insulating part and electrically connected to the LED chip. The sheet-shaped connecting member is disposed on the other surface side of the heat transfer plate to connect the heat transfer plate to a metal member for holding the chip mounting member, and the sheet-shaped connecting member has an electrical insulating property and connects the heat transfer plate and the metal member thermally to each other.

In the light-emitting device of the present invention, because the sheet-shaped connecting member which is disposed on the other surface side of the heat transfer plate to connect the heat transfer plate to a metal member for holding the chip mounting member and has an electrical insulating property and thermally connects the heat transfer plate and the metal member to each other is provided, it is possible to lessen a heat resistance from the light-emitting part of the LED chip to the metal member for holding the chip mounting member as compared with a case where a rubber sheet-shaped heat radiation sheet is interposed. Therefore, it is possible to increase the heat radiation property and reduce the variation of heat resistances, and it is possible to constrain a rise of a junction temperature of the LED chip. As a result, it is possible to increase the input power to increase a power of the light output. Furthermore, when the light-emitting device is used at the same light output as that of the prior art, it is possible to reduce the junction temperature of the LED chip as compared to that of the prior art. So, it has an advantage that the life span of the LED chip can be extended.

Preferably, the LED chip has a light-emitting part made of a GaN-based compound semiconductor material on a main surface side of a conductive substrate formed from a SiC substrate or a GaN substrate.

In this case, it is possible to set a lattice constant of a substrate for crystal growth of the LED chip close to that of the GaN-based compound semiconductor material, and, because the substrate for crystal growth has conductivity, it is possible to form an electrode on the substrate for crystal growth, In addition, as compared with a case where the substrate for crystal growth is a sapphire substrate, the heat transfer property of the substrate for crystal growth is superior, so it is possible to reduce the heat resistance of the substrate for crystal growth. Therefore, it is possible to improve the heat radiation property.

Preferably, the light-emitting device further includes a sub-mount member which is larger in chip size than the LED chip and is disposed between the LED chip and the heat transfer plate to relieve a stress applied to the LED chip due to a difference in linear expansion coefficient between the LED chip and the heat transfer plate.

In this case, it is possible to prevent the LED chip from being damaged due to the difference in linear expansion coefficient between the conductive substrate and the heat transfer plate of the LED chip. Therefore, it is possible to increase the reliability of the chip.

Preferably, the connecting member is made of a resin sheet which includes a filler and whose viscosity is reduced by heating.

In this case, the problem that lack of adhesion between the chip mounting member and the connecting member produces air spaces between the chip mounting member and the connecting member and increases the heat resistance, or the problem that aging degradation of the connecting member produces a gap between the chip mounting member and the connecting member and increases the heat resistance can be prevented.

Preferably, the connecting member is configured to have a plane size larger than that of the heat transfer plate.

In this case, as compared with a case where the connecting member and the heat transfer plate have the same plane size, it is possible to lengthen a creepage distance between the heat transfer plate and the metal member, so that it is possible to enhance a lighting surge protection when the device is used as a light source of a luminaire.

BEST MODE FOR CARRYING OUT THE INVENTION

First Embodiment

Figure 1:
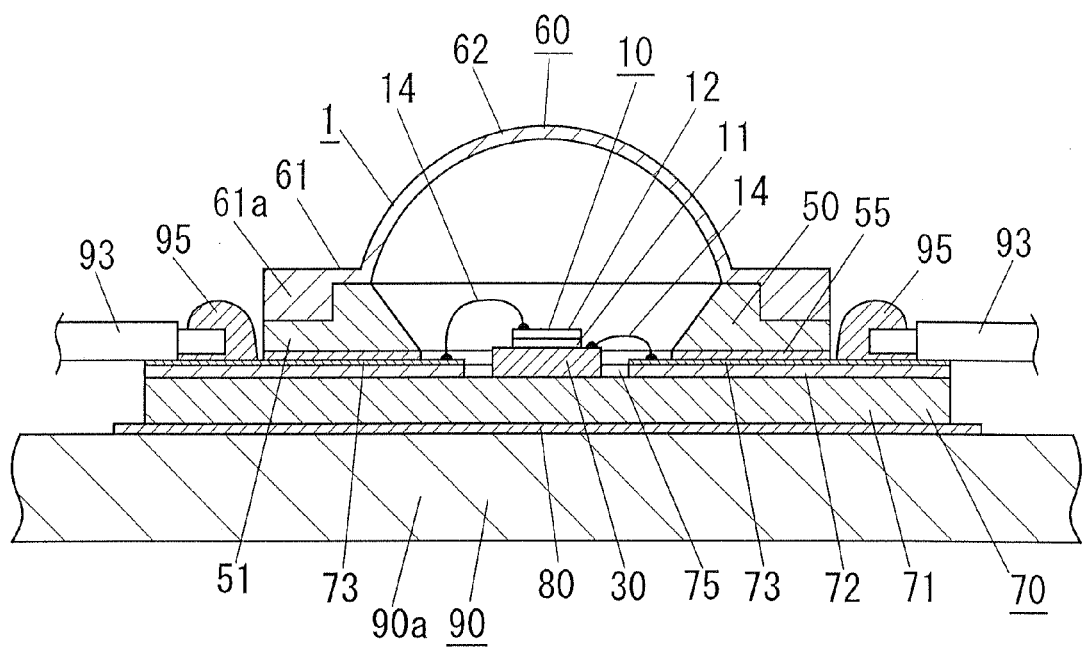
FIG. 1 is a schematic cross-sectional view showing main sections of a light-emitting device in accordance with a first embodiment of the present invention when the device is mounted on a body of a luminaire.
Figure 2:
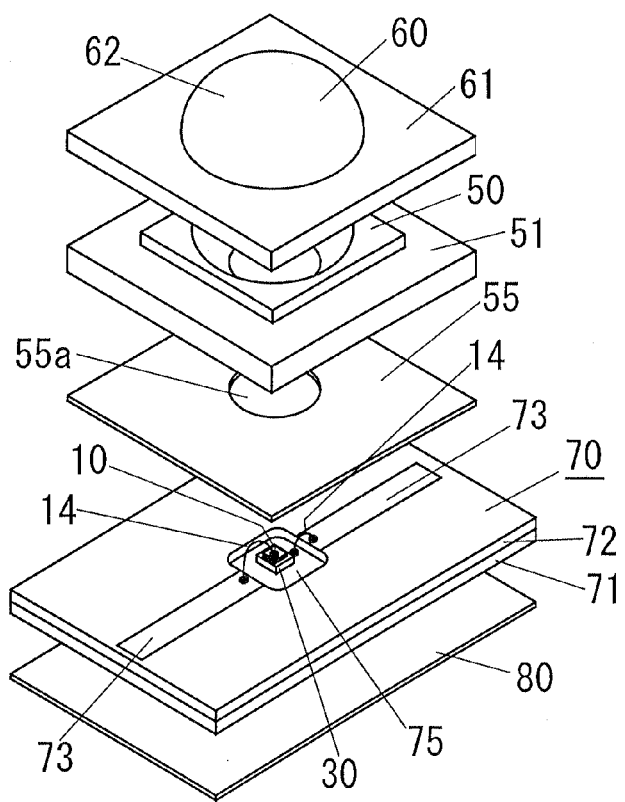
FIG. 2 is a schematic exploded perspective view of the light-emitting device of FIG. 1.

Hereinafter, a light-emitting device of the present embodiment will be explained with reference to FIG. 1 to FIG. 4.

A light-emitting device (LED chip unit) 1 of the present embodiment is used as a light source of a luminaire, and includes: an LED chip 10 in a form of a rectangular plate, a chip mounting member 70, a sub-mount member 30, a reflector (reflecting device) 50, a protective cover 60, and a sheet-shaped connecting member 80. The chip mounting member 70 has a conductive plate 71 in a form of a rectangular plate and conductor patterns (lead patterns) 73, 73. The conductive plate 71 is formed to have a chip size larger than that of the LED chip 10, and the LED chip 10 is mounted to one surface side of the conductive plate 71. The conductor patterns 73, 73 are formed on the one surface side of the conductive plate 71 through an insulating part 72 and electrically connected to the LED chip 10. The sub-mount member 30 is disposed between the conductive plate 71 and the LED chip 10 for relieving a stress applied to the LED chip 10 due to a difference in linear expansion coefficient between the conductive plate 71 and the LED chip 10. The reflector 50 is disposed on one surface of the chip mounting member 70 in such a way that it surrounds the LED chip 10 for reflecting the light emitted from the side surfaces of the LED chip 10 toward the front of the LED chip 10 (upward in FIG. 1). The protective cover 60 is attached to front of the reflector 50 to cover the LED chip 10. The sheet-shaped connecting member 80 is disposed on the other surface side of the conductive plate 71 to connect the conductive plate 71 to a metal body 90 of the luminaire for holding the chip mounting member 70, and it has an electrical insulating property, and it thermally connects the conductive plate 71 and the body 90 of the luminaire to each other. In the present embodiment, the body 90 of the luminaire is the metal member for holding the chip mounting member 70, but any metal member other than the body 90 of the luminaire may be used to hold the chip mounting member 70. The metal member may be formed of a material having a high heat conductivity, such as Al and Cu. In the present embodiment, the chip mounting member 70, the reflector 50, and the protective cover 60 form a package of the LED chip 10. And, in the present embodiment, the conductive plate 71 is a heat transfer plate which is made of a heat conductive material and one surface side of which the LED chip 10 is mounted on.

The luminaire in the present embodiment is used as a spotlight for example, and a rotation base 110 is fixed to a support table 100, and an arm 112 is coupled to the rotation base 110 at one end thereof using a shaft screw 111, and the body 90 of the luminaire is coupled to the arm 112 using a threaded screw 113.

Figure 3:
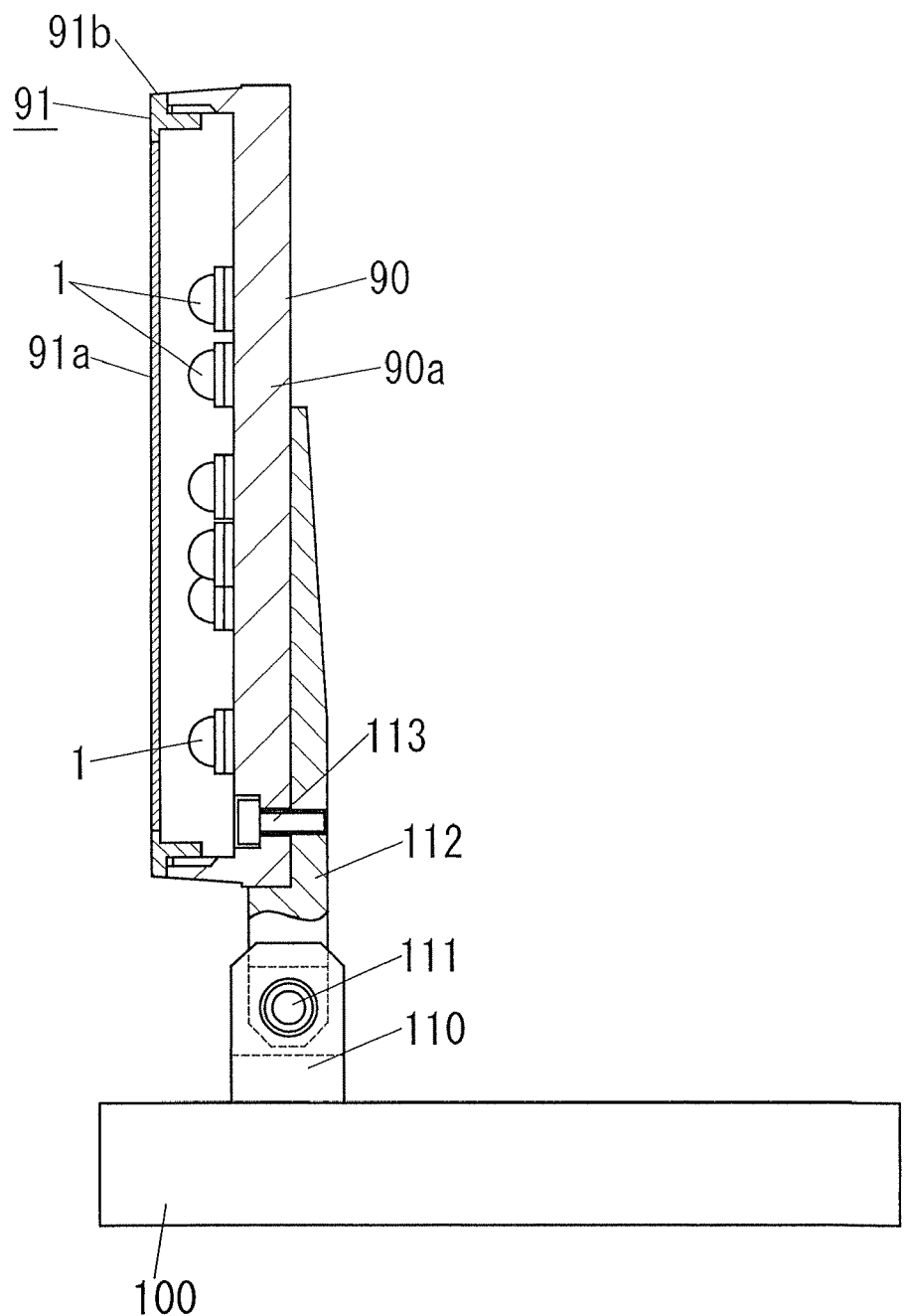
FIG. 3 is a schematic side view, partially broken away, of the luminaire of FIG. 1.
Figure 4:
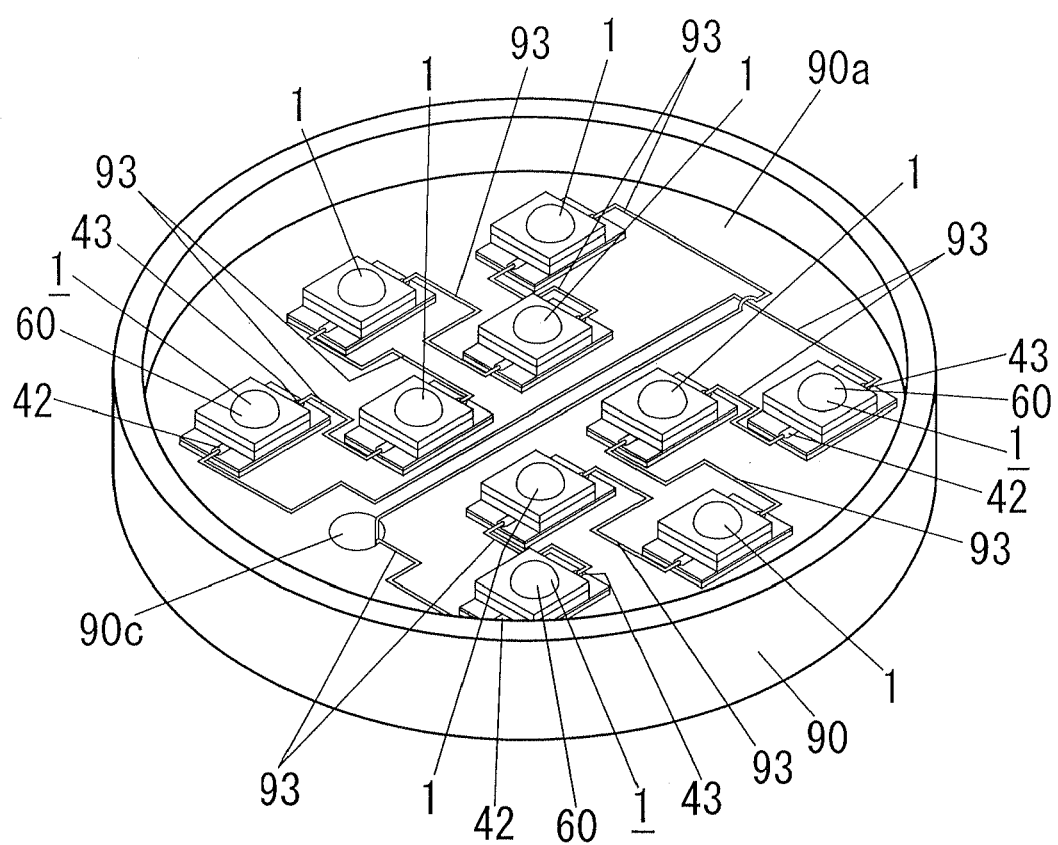
FIG. 4 is a schematic perspective view showing main sections of the luminaire.
Figure 5:
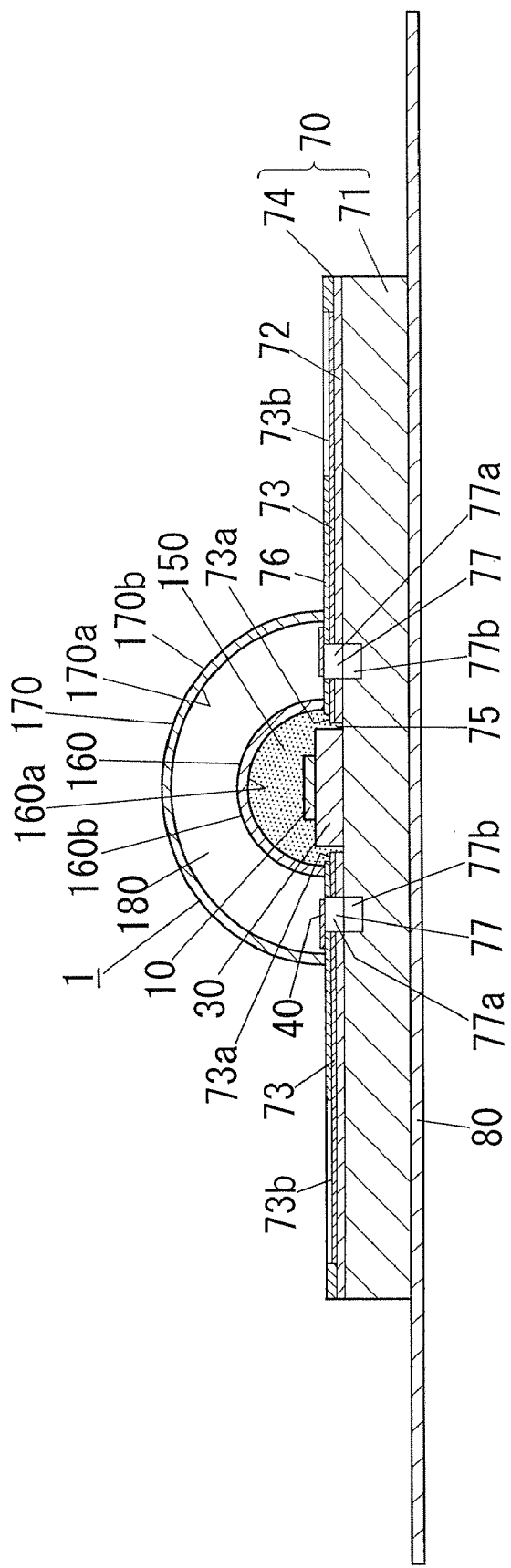
FIG. 5 is a schematic cross-sectional view showing a light-emitting device in accordance with a second embodiment of the present invention.

In the luminaire of this embodiment, as shown in FIG. 3 and FIG. 4, the body 90 has a cylindrical shape having a bottom and an opening on the other side of the bottom, and the plurality of light-emitting devices 1 are housed in the body 90. In the luminaire of this embodiment, each of the light-emitting devices 1 is mounted on a bottom wall 90a of the body 90 through the connecting member 80, and the opening of the body 90 is closed by a front cover 91. The front cover 91 includes a translucent plate 91a made of a circular glass plate, and a ring-shaped window frame 91b for holding the translucent plate 91a, and the ring-shaped window frame 91b is attached to the body 90. The translucent plate 91a is not limited to a glass substrate, but may be made of any translucent material. And, the translucent plate 91a may integrally include a lens for controlling the distribution of light emitted from each of the light-emitting devices 1.

The plurality of light-emitting devices 1 housed in the body 90 are connected in series to each other by a plurality of leads 93 (see FIG. 1 and FIG. 3), and the leads 93 on both ends of a series circuit of the plurality of light-emitting devices 1 are inserted into an insertion hole 90c formed through the bottom wall 90a of the body 90 to receive power from a power source circuit (not shown). As the power supply circuit, for example, a power supply circuit having a rectifier circuit using a diode bridge for rectifying and smoothing an AC output from an AC power source such as a commercial power supply, and a smoothing capacitor for smoothing the output of the rectifier circuit may be adopted. In the present embodiment, the plurality of light-emitting devices 1 in the body 90 of the luminaire are connected in series, but the connection relation of the plurality of light-emitting devices 1 is not limited to that. For example, the light-emitting devices 1 may be connected in parallel, or a series connection and a parallel connection may be combined.

The LED chip 10 is a GaN-based blue LED chip which emits blue light, and as the substrate for crystal growth, used is a conductive substrate 11 made of an n-type SiC substrate which has a lattice constant and a crystal structure that are closer to those of GaN, as compared to those of a sapphire substrate, and has a conductivity. A light-emitting part 12, which is made of a GaN-based compound semiconductor material and has a multi-layered structure such as double-heterostructure, is grown by epitaxial growth method (for example, MOVPE method) on a main surface side of the conductive substrate 11. A cathode electrode (n-Type electrode) (not shown) is formed on a back surface of the conductive substrate 11, and an anode electrode (p-Type electrode) (not shown) is formed on a front surface of the light-emitting part 12 (an outermost surface on the main surface side of the conductive substrate 11). In short, the LED chip 10 has an anode electrode formed on one surface thereof, and a cathode electrode formed on the other surface thereof. The cathode electrode and the anode electrode have a multi-layered structure having a Ni film and an Au film, but the material of the cathode electrode and the anode electrode is not limited to that, and the cathode electrode and the anode electrode may be made of any material which can obtain a high Ohmic characteristic, such as Al.

In the LED chip 10, the anode electrode is electrically connected to one end (inner lead part) of one conductor pattern 73 on the chip mounting member 70 through a bonding wire 14 (a left bonding wire 14 in FIG. 1); the cathode electrode is electrically connected to one end (inner lead part) of the other conductor pattern 73 on the chip mounting member 70 through the sub-mount member 30 and a bonding wire 14 (a right bonding wire 14 in FIG. 1), and the other end of each conductor pattern 73 is electrically connected to the lead 93 via a connecting part 95 made of solder.

In the chip mounting member 70, as a material of the conductive plate 71, a conductive material having a conductive property and a relatively high thermal conductivity, such as Cu and phosphor bronze, may be adopted, and as a material of the conductor patterns 73, 73, Cu may be adopted, for example. As a material of the insulating part 72 of the chip mounting member 70, a resin having an insulating property, such as glass epoxy resin such as FR-4, polyimide-based resin, and phenol resin may be adopted. In the present embodiment, the chip mounting member 70 is provided with window hole 75 at the center of the insulating part 72 for partially exposing a surface of the conductive plate 71, and the LED chip 10 is mounted to the conductive plate 71 through the sub-mount member 30 disposed inside the window hole 75. The conductive plate 71 only has to have about the same thickness as that of a lead frame. Therefore, as compared with the circuit boards of the light-emitting devices disclosed in the above Patent Documents 1 and 2, it is possible to reduce the thickness of the circuit board.

In the present embodiment, the light-emitting part 12 of the LED chip 10 is mounted to the conductive plate 71 in such a way that the light-emitting part 12 is positioned on a side further away from the conductive plate 71 than the conductive substrate 11. But, the light-emitting part 12 of the LED chip 10 may be mounted to the conductive plate 71 in such a way that the light-emitting part 12 is positioned on a side closer to the conductive plate 71 than the conductive substrate 11. In terms of the light output efficiency, it is desired that the light-emitting part 12 is disposed on the side away from the conductive plate 71. But, since the conductive substrate 11 and the light-emitting part 12 have similar refractive indexes in the present embodiment, even if the light-emitting part 12 is disposed on the side near the conductive plate 71, it does not result in a substantial drop of the light output efficiency.

The reflector 50 has a frame shape having a circular opening therein. The opening has an opening area which increases as the distance from the LED chip 10 increases in the thickness direction of the LED chip 10. The reflector 50 is fixedly attached to the chip mounting member 70 by using a fixing member 55 made of a sheet-shaped adhesive film having an insulating property.

As a material of the reflector 50, a material which has a relatively high reflectivity with respect to the light (blue light in the present invention) emitted from the LED chip 10, for example, Al, may be adopted. The fixing member 55 has a circular opening 55a formed therein which corresponds to the opening of the reflector 50. It is desired that a transparent encapsulation resin (for example, silicone resin) for sealing the LED chip 10 is potted in the reflector 50.

The protective cover 60 includes: a dome-shaped cover section 62 with the center being positioned on the central line along the thickness direction of the LED chip 10; and a projected flange section 61 which is continuously and integrally formed with the peripheral edge of an opening of the cover section 62. An annular positioning rib 61a is protruded from the periphery of the surface of the flange section 61 on the side toward the reflector 50 so that the protective cover 60 can be stably positioned relative to the reflector 50. The protective cover 60 may be attached to the reflector 50 using an adhesive (for example, silicone resin, and epoxy resin) for example.

The protective cover 60 is a molding of a mixture of a translucent material, such as silicone, and a particulate yellow phosphor which is excited by the blue light emitted from the LED chip 10 and emits broad yellowish light. Therefore, in the light-emitting device 1 of the present embodiment, the protective cover 60 also functions as a color conversion part which emits a light having a color different from the emission color of the LED chip 10 when excited by the light emitted from the LED chip 10, so that the entire light-emitting device 1 composes a white LED for outputting a white light which is a combination of the blue light emitted from the LED chip 10 and the light emitted from the yellow phosphor. The translucent material of the protective cover 60 is not limited to silicone, and may be acrylic resin, epoxy resin, or glass for example. The phosphor which is mixed with the translucent material used for the protective cover 60 is not limited to the yellow phosphor. For example, a red phosphor and a green phosphor may be mixed with the translucent material to obtain the white light. When the emission color of the LED chip 10 is the same color as a desired emission color of the light-emitting device 1, it is not necessary to mix a phosphor to the translucent material.

In the present embodiment, as described above, the LED chip 10 is a blue LED chip having a blue emission color, and the conductive substrate 11 is a SiC substrate. But, a GaN substrate may be used as a substitute for the SiC substrate. In the case where a SiC substrate or a GaN substrate is used, as seen from Table 1 below, as compared with the case where a sapphire substrate, which is an insulator, is used as the substrate for crystal growth as above-mentioned Patent Document 2, the thermal conductivity of the substrate for crystal growth is high, and the heat resistance thereof is low. The emission color of the LED chip 10 is not limited to blue, but may be red or green. That is, the material of the light-emitting part 12 of the LED chip 10 is not limited to a GaN-based compound semiconductor material, but a GaAs based compound semiconductor material or GaP based compound semiconductor material may be used depending on an emission color of the LED chip 10. Also, the conductive substrate 11 is not limited to a SiC substrate, and may be selected from a GaAs substrate, a GsP substrate, and the like depending on a material of the light-emitting part 12.

TABLE 1

| Substrate For Crystal Growth | Thermal Conductivity [W/m·K] | Coefficient of Linear Expansion [×10⁻⁶/K] | Heat Resistance [K/W] |
|---|---|---|---|
| 6H—SiC | 350 | 4.2 | 0.857 |
| GaN | 130 | 5.59 | 2.308 |
| GaP | 110 | 4.65 | 2.727 |
| GaAs | 54 | 5.9 | 5.556 |
| Sapphire | 42 | 5.3 | 7.143 |

The LED chip 10 is formed into the rectangular plate shape having a chip size larger than that of the LED chip 10 as described above, and is mounted to the conductive plate 71 through the sub-mount member 30 for relieving a stress which is applied to the LED chip 10 due to a difference in linear expansion coefficient between the LED chip 10 and the conductive plate 71. The sub-mount member 30 functions not only to relieve the stress applied to the LED chip 10, but also to transfer the heat generated at the LED chip 10 to a wider area of the conductive plate 71 than the chip size of the LED chip 10. Therefore, it is preferable that the surface area of the conductive plate 71 on the LED chip 10 side is adequately larger than that of the LED chip on the chip mounting member 70 side. For example, in order to efficiently waste the heat from the LED chip 10 of 0.3 to 1.0 mm squared, it is preferable that the contact area between the conductive plate 71 and the connecting member 80 is increased and the heat resistance is reduced by transferring the heat of the LED chip 10 uniformly to a wide area, and it is desired that the surface area of the conductive plate 71 on the LED chip 10 side is more than ten times that of the LED chip 10 on the conductive plate 71 side. The sub-mount member 30 only has to relieve a stress applied to the LED chip 10, and since the thickness dimension of the sub-mount member 30 can be made smaller than those of circuit boards of the light-emitting devices disclosed in the above Patent Documents 1 and 2, it is possible to reduce the heat resistance by adopting a material having a relatively high thermal conductivity.

In this embodiment, the sub-mount member 30 is made of CuW. And, in the LED chip 10, as described above, the anode electrode is electrically connected to one conductor pattern 73 via the bonding wire 14 and the cathode electrode is electrically connected to the other conductor pattern 73 via the sub-mount member 30 and another bonding wire 14.

The material of the sub-mount member 30 is not limited to CuW, and for example as seen from Table 2 below, any material having a linear expansion coefficient which is relatively close to that of 6H-SiC, that is the material of the conductive substrate 11, and a relatively high thermal conductivity may be used, such as W, AlN, composite SiC, and Si. When the sub-mount member 30 is formed of an insulator such as AlN and composite SiC, for example, an electrode pattern may be conveniently provided on the surface of the sub-mount member 30 on LED chip 10 side to be connected with the cathode electrode, and the electrode pattern may be electrically connected with the other conductor pattern 73 via the bonding wire 14.

TABLE 2

| | Materials | Coefficient of Linear Expansion [×10⁻⁶/K] | Thermal conductivity [W/m·K] |
|---|---|---|---|
| Material of Substrate For Crystal Growth | 6H—SiC | 4.2 | 350 |
| | GaN | 5.59 | 130 |
| | GaP | 4.65 | 110 |
| | GaAs | 5.9 | 54 |
| | Sapphire | 5.3 | 42 |
| Material of Sub-mount Member | Al | 23.2 | 237 |
| | Cu | 16.6 | 398 |
| | W | 4.5 | 178 |
| | CuW | 6.4 | 160 |
| | Si | 2.6 | 168 |
| | AlN | 4.6 | 165 |
| | Alumina | 7.1 | 29 |
| Connecting Material | Au | 14.2 | 315 |
| | 63Sn—37Pb | 21.0 | 50 |
| | Silver Paste | 70.0 | 1.1 |

In a case where the conductive plate 71 is made of Cu, it is possible to connect the sub-mount member 30 and the conductive plate 71 directly to each other, when CuW or W is adopted as the material of the sub-mount member 30. In that case, as shown in Table 3 below, as compared with a case where the sub-mount member 30 and the conductive plate 71 are connected to each other using a brazing material for example, it is possible to increase the connection area between the sub-mount member 30 and the conductive plate 71 and reduce the heat resistance at the connection part therebetween. The LED chip 10 and the sub-mount member 30 may be connected to each other using a Pb-free solder such as AuSn and SnAgCu, but when AuSn is used for the connection, the surface of the sub-mount member 30 for the connection should be subjected to a pretreatment for forming a metal layer of Au or Ag in advance.

TABLE 3

|  | Brazing | Direct Connection |
| --- | --- | --- |
| Connecting Area | 60-80% | Almost 100% |
| Connecting Strength | 98 N/mm$^2$ or more | 127 N/mm$^2$ or more |
| Shear Strength | 98 N/mm$^2$ | 127 N/mm$^2$ |
| Connecting Part | Flux is sometimes left. |  |

When the sub-mount member 30 is made of W and the sub-mount member 30 and the conductive plate 71 are connected to each other directly, as seen from Table 4 below, the thermal conductivity is increased and the heat resistance can be reduced therebetween, as compared with a case where the sub-mount member 30 and the conductive plate 71 are connected to each other using silver solder. When the conductive plate 71 is made of Cu and the sub-mount member 30 is made of AlN, composite SiC, or the like, the conductive plate 71 and the sub-mount member 30 may be connected to each other using a Pb-free solder such as AuSn and SnAgCu, but when AuSn is used for the connection, the surface of the conductive plate 71 for the connection should be subjected to a pretreatment for forming a metal layer of Au or Ag in advance.

TABLE 4

|  | Ag Brazing | Direct Connection |
| --- | --- | --- |
| Thermal Conductivity [W/m·K] | 185.4 | 211.8 |

By the way, the light-emitting device 1 of the present embodiment includes, as described above, the sheet-shaped connecting member 80 disposed on the other surface side of the conductive plate 71 to connect the conductive plate 71 to the metal body 90 of the luminaire for holding the chip mounting member 70 and having an electrical insulating property, and thermally connecting the conductive plate 71 and the body 90 of the luminaire to each other is provided, and the light-emitting device 1 is connected to the body 90 of the luminaire through the connecting member 80. That is, in the luminaire of the present embodiment, the sheet-shaped connecting member 80 is interposed between the conductive plate 71 of the chip mounting member 70 of each light-emitting device 1 and the body 90 of the luminaire which is a metal member, and the connecting member 80 has a function of providing electrical isolation between the conductive plate 71 and the body 90 of the luminaire and also of thermally connecting both of them to each other.

If a heat radiation sheet of the prior art is interposed between conductive plate 71 and the body 90 of the luminaire, the heat radiation sheet may cause lack of adhesion between the conductive plate 71 and the heat radiation sheet, which may result in an increase of the heat resistance due to air spaces generated between the sheet and the plate, or which may result in various heat resistances between each of the light-emitting devices 1 and the body 90 of the luminaire.

To the contrary, in the light-emitting device 1 of the present embodiment, the sheet-shaped connecting member 80 is made of a resin sheet (for example, an organic green sheet such as an epoxy resin sheet which is highly filled with fused silica) which includes a filler, such as silica and alumina, and whose viscosity is reduced by heating. So, the member 80 has an electrical insulating property, a high thermal conductivity, a high flowability in heating, and a high adhesion property to convex-concave surfaces. Therefore, it is possible to prevent the generation of an air space (air gap) between the connecting member 80 and the conductive plate 71 and between the connecting member 80 and the body 90 of the luminaire when the conductive plate 71 is connected to the metal body 90 of the luminaire through the connecting member 80 (in more detail, when the conductive plate 71 and the body 90 of the luminaire are connected to each other by interposing the connecting member 80 between the conductive plate 71 of the chip mounting member 70 and the body 90 and heating the connecting member 80), and it is possible to prevent an increase and generation of variation of the heat resistances due to lack of adhesion. As a result, as compared with the case where the LED chip 10 is mounted to a circuit board and a rubber sheet-shaped heat radiation sheet such as Sarcon (registered trademark) is disposed between the circuit board and the body 90 of the luminaire as in the prior art, it is possible to reduce the heat resistance from the LED chip 10 to the body 90 of the luminaire and the heat radiation property can be enhanced. And also, the variation of the heat resistance is reduced, and a rise of a junction temperature of the LED chip 10 can be prevented. So, it is possible to increase the input power to increase the power of the light output. As to the connecting member 80, for example, when the effective contact area for heat conduction to the body 90 of the luminaire is 25 mm$^2$ and the thickness of the connecting member 80 is 0.1 mm, in order to control the heat resistance of the connecting member 80 to 1 K/W or less, the thermal conductivity of the connecting member 80 has to be 4 [W/m·K] or more, and when the epoxy resin sheet highly filled with fused silica as described above is adopted, it can satisfy the condition.

The sub-mount member 30 interposed between the LED chip 10 and the conductive plate 71 is not indispensable when the difference in linear expansion coefficient between the LED chip 10 and the conductive plate 71 is relatively small. When the sub-mount member 30 is not interposed between the LED chip 10 and the conductive plate 71, a distance between the LED chip 10 and the bottom wall 90a of the metal body 90 of the luminaire becomes shorter, whereby the heat resistance from the light-emitting part 12 of the LED chip 10 to the body 90 is more reduced and the heat radiation property is more increased. So, it is possible to increase the power of the light output more.

Second Embodiment

Hereinafter, a light-emitting device of this embodiment will be explained with reference to FIG. 5 to FIG. 11.

The light-emitting device 1 of the present embodiment is generally configured in the same manner as that of the first embodiment, but unlike the first embodiment, it includes a dome-shaped optical member 160, a sealing part 150, and a dome-shaped color converting member 170. The dome-shaped optical member 160 controls the distribution of light emitted from the LED chip 10, and it is made of a translucent material, and is fixedly attached to one surface side (the upper surface side in FIG. 5) of the chip mounting member 70 in such a way that the LED chip 10 is housed between the dome-shaped optical member 160 and the chip mounting member 70. The sealing part 150 is made of an encapsulation resin and has a translucency and an elasticity, and it seals the LED chip 10 and a plurality of (four in this embodiment) bonding wires 14 that are electrically connected to the LED chip 10 in the space surrounded by the optical member 160 and the chip mounting member 70. The dome-shaped color converting member 170 is a molding made of a translucent material and a phosphor which emits a light having a color different from an emission color of the LED chip 10 when excited by the light emitted from the LED chip 10 and passed through the sealing part 150 and the optical member 160. The dome-shaped color converting member 170 is disposed on the one surface side of the chip mounting member 70 in such a way that an air layer 180 is formed between the dome-shaped color converting member 170 and a light output surface 160b of the optical member 160. Similar parts to the first embodiment are identified by the same reference character and no duplicate explanation is made here.

Figure 6:
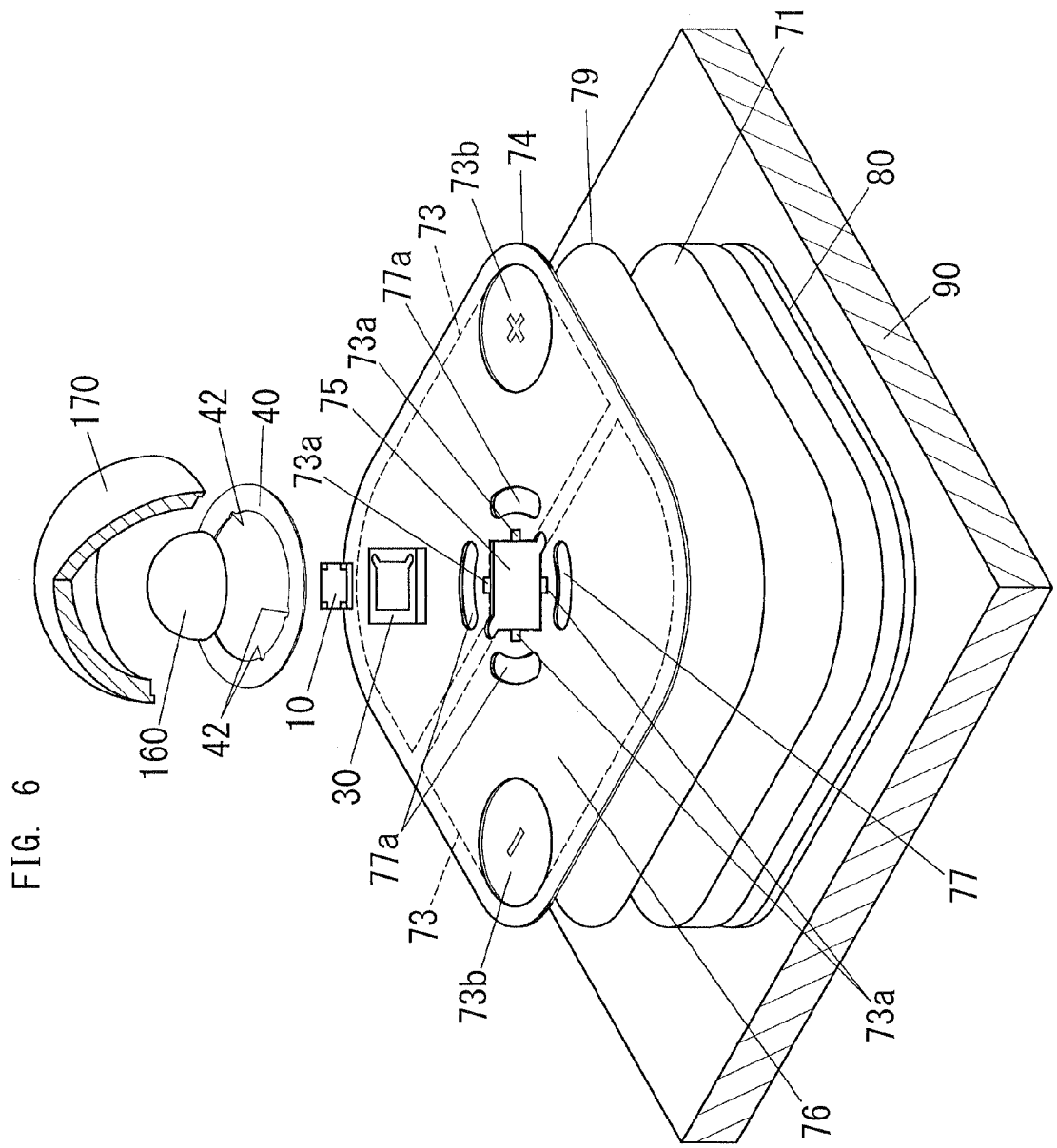
FIG. 6 is a schematic exploded perspective view showing main sections of a luminaire which uses the light-emitting device of FIG. 5.

A chip mounting member 70 of the present embodiment includes a conductive plate 71 in the form of a rectangular plate on which the LED chip 10 is mounted via the sub-mount member 30, and a wiring board 74 which is a flexible printed wiring board in the form of a rectangular plate and is fixedly attached to one surface side of the conductive plate 71 via a polyolefin-based fixing sheet 79 (see FIG. 6). The chip mounting member 70 includes conductor patterns 73, 73 which are provided on a surface of the wiring board 74 on the conductive plate 71 side via the insulating part 72 made of insulating substrate and are electrically connected to the LED chip 10. The insulating part 72 has a window hole 75 at the center thereof for partially exposing one surface of the conductive plate 71, and the LED chip 10 is mounted to the conductive plate 71 via the sub-mount member 30 arranged inside the window hole 75. The insulating part 72 of the wiring board 74 is made using a polyimide film, and each of the conductor patterns 73, 73 is configured as a multi-layered film including a Cu film, a Ni film, and an Au film.

The wiring board 74 has a resist layer 76 laminated on a surface on the opposite side of the conductive plate 71, and the resist layer 76 is made of a white resin for reflecting the light emitted from the LED chip 10.

In this embodiment, the sub-mount member 30 is made of AlN that has a relatively high thermal conductivity and an insulating property. The LED chip 10 has anode electrodes 13a formed at two adjacent corners on one surface side thereof (see FIG. 7 and FIG. 8A), and has cathode electrodes 13b formed at the other two corners thereof (see FIG. 7 and FIG. 8A). Each of the anode electrodes 13a is electrically connected to one of the conductor patterns 73 via a bonding wire 14, and each of the cathode electrodes 13b is electrically connected to the other of the conductor patterns 73 via another bonding wire 14. The resist layer 76 of the wiring board 74 is patterned so as to expose two portions of each of the conductor patterns 73 near the window hole 75 and also expose one part of each of the conductor patterns 73 at the peripheral part of the wiring board 74. In each of the conductor patterns 73, the two portions exposed near the window hole 75 form terminal parts 73a to be connected to bonding wires 14, and the circular portions exposed at the peripheral parts of the resist layer 76 form electrode sections 73b to be connected to the exterior. Out of the two electrode sections 73b, the electrode section 73b to which each anode electrode 13a of the LED chip 10 is electrically connected (the right electrode section 73b in FIG. 7) has a mark "+" thereon, and the electrode section 73b to which each cathode electrode 13b of the LED chip 10 is electrically connected (the left electrode section 73b in FIG. 7) has a mark "−" thereon, which enables a visual recognition of the polar of the electrode sections 73a, 73b in the light-emitting device 1, whereby it is possible to prevent an error connection.

Figure 8A:
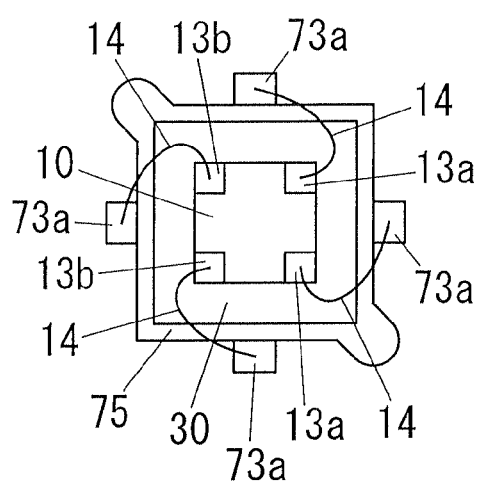
FIG. 8A is a view illustrating main sections of the light-emitting device of FIG. 5.
Figure 8B:
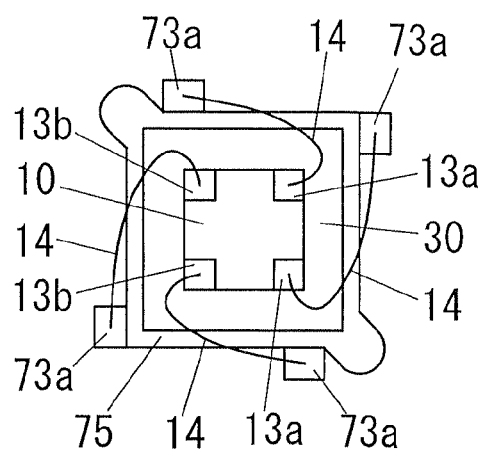
FIG. 8B is a view illustrating main sections of the light-emitting device of FIG. 5.
Figure 9:
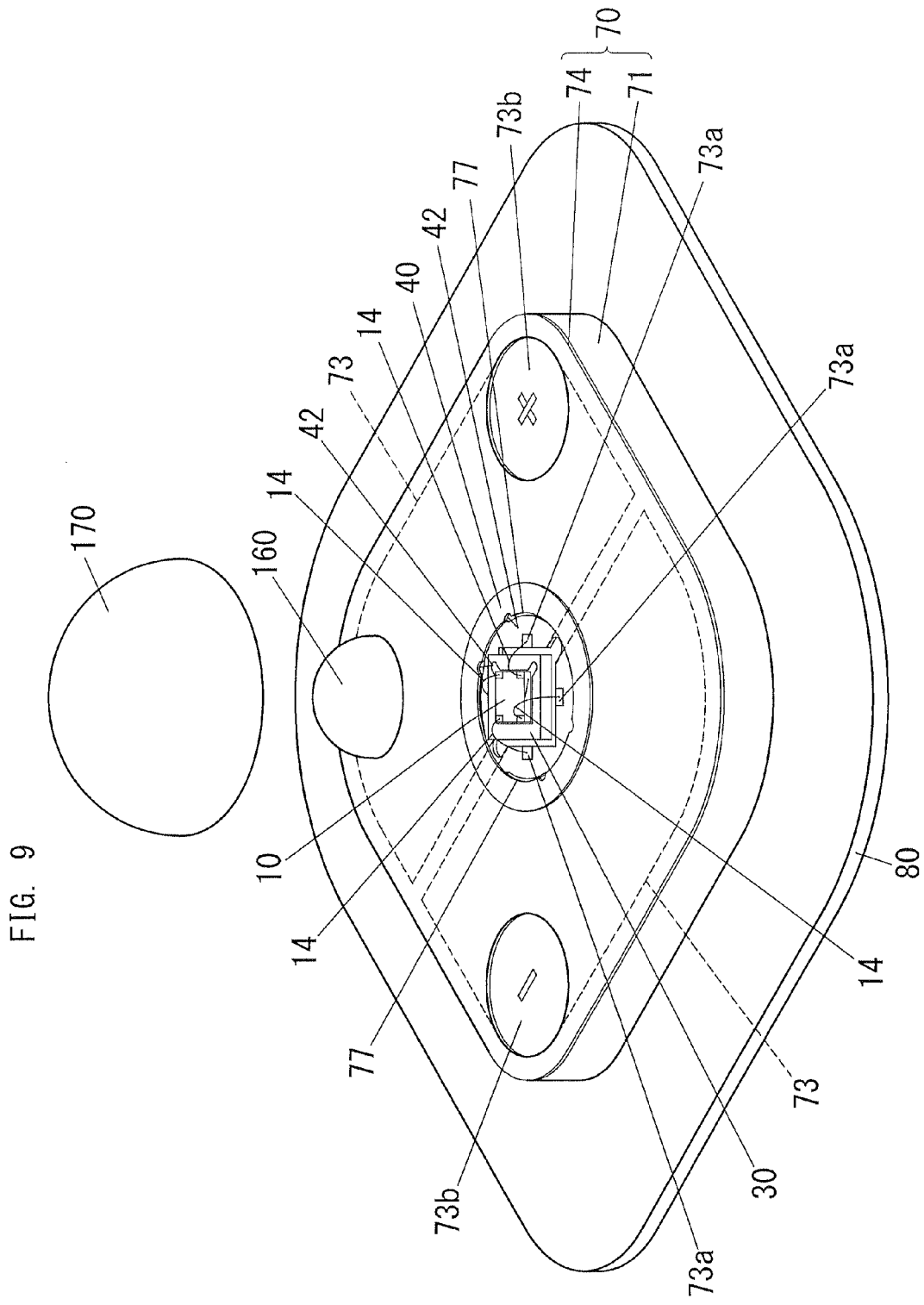
FIG. 9 is a schematic exploded perspective view of the light-emitting device of FIG. 5.

In the present embodiment, the window hole 75 in the wiring board 74 is formed into a rectangular shape, as shown in FIG. 8A, and the terminal parts 73a are provided around at the middle of each side of the rectangular window hole 75. But, as shown in FIG. 8B, when the terminal parts 73a are formed near one end of each side of the window hole 75, respectively, it is possible to lengthen the entire length of each bonding wire 14, whereby it is possible to increase the reliability of the device.

The LED chip 10 and the sub-mount member 30 may be connected to each other by using a solder, such as SnPb, AuSn, and SnAgCu, or silver paste for example, but preferably they are connected to each other by using a Pb-Free solder such as AuSn and SnAgCu.

The encapsulation resin used to make the sealing part 150 is a silicone resin, but the material is not limited to a silicone resin, and an acrylic resin may be used for example.

The optical member 160 is a molding of a translucent material (for example, silicone), and is formed in a dome shape. In this embodiment, since the optical member 160 is a silicone molding, it is possible to reduce differences in refractive index and linear expansion coefficient between the optical member 160 and the sealing part 150. When the sealing part 150 is made of an acrylic resin, it is preferable that the optical member 160 is also made of the acrylic resin.

Furthermore, the optical member 160 is configured so that the light output surface 160b has a convex surface which does not totally reflect the light entered therein from a light incident surface 160a at the boundary between the light output surface 160b and the air layer 180, and the optical member 160 is arranged so that the light axis thereof is aligned with that of the LED chip 10. Therefore, the light emitted from the LED chip 10 and entered in the light incident surface 160a of the optical member 160 is not totally reflected at the boundary between the light output surface 160b and the air layer 180, and it becomes easy for the light to reach the color converting member 170, whereby it is possible to increase the whole light flux. The light emitted from the sides of the LED chip 10 is propagated in the sealing part 150, the optical member 160, and the air layer 180, and reaches the color converting member 170, and the light excites the phosphor of the color converting member 170 or passes through the color converting member 170 without hitting the phosphor. The optical member 160 is formed to have a uniform thickness along the direction normal to the optical member 160 independently of the positions thereof.

The color converting member 170 is a molding of a mixture of a translucent material, such as silicone, and a particulate yellow phosphor which is excited by the blue light emitted from the LED chip 10 and emits broad yellowish light (that is, the color converting member 170 contains a phosphor). Therefore, in the light-emitting device 1 of this embodiment, the blue light emitted from the LED chip 10 and the light emitted from the yellow phosphor are both emitted through the outer surface 170b of the color converting member 170, whereby a white light can be obtained. The translucent material used for the color converting member 170 is not limited to silicone, and acrylic resin or glass may be adopted, for example. Also, the phosphor which is mixed to the translucent material used as the material of the color converting member 170 is not limited to a yellow phosphor, and for example, a red phosphor or a green phosphor may be mixed to obtain the white light.

In the color converting member 170, an inner surface 170a is formed to follow the shape of the light output surface 160b of the optical member 160. Therefore, the distance between the light output surface 160b and the inner surface 170a of color converting member 170 is generally a steady value along the direction normal thereto independently of the positions of the light output surface 160b of the optical member 160. The color converting member 170 is molded to have a uniform thickness along the direction normal to the color converting member 170 independently of the positions thereof.

In the light-emitting device 1 of the present embodiment, since the air layer 180 is formed between the color converting member 170 and the optical member 160, when an external force acts on the color converting member 170, a possibility that the color converting member 170 is deformed by the external force and makes contact with the optical member 160 is reduced, So, it can be prevented that the stress applied to the color converting member 170 by the external force is transmitted to the LED chip 10 and each bonding wire 14 via the optical member 160 and the sealing part 150. Therefore, variations in light emitting property of the LED chip 10 and disconnection of each bonding wire 14 due to the external force are less likely to occur, and the reliability can be increased. In addition, the air layer 180 formed between the color converting member 170 and the optical member 160 provides advantages that moisture in the ambient atmosphere does not easily reach the LED chip 10, and that the amount of light which is emitted by the LED chip 10 and passes through the sealing part 150 and the optical member 160 and enters the color converting member 170 and then is scattered by the powder of yellow phosphor in the color converting member 170 toward the optical member 160 and passes through the optical member 160 is reduced, and as a result, the light output efficiency of the light-emitting device 1 to the exterior can be increased as a whole.

In the light-emitting device 1 of this embodiment, the thickness dimension of the sub-mount member 30 is set so that the surface of the sub-mount member 30 is more separated from the conductive plate 21 than the surface (the surface of the resist layer 76) of the wiring board 74, thereby the light emitted from the LED chip 10 to the side direction can be prevented from being absorbed to the wiring board 74 through the inner surface of the window hole 75 formed in the wiring board 74.

Figure 7:
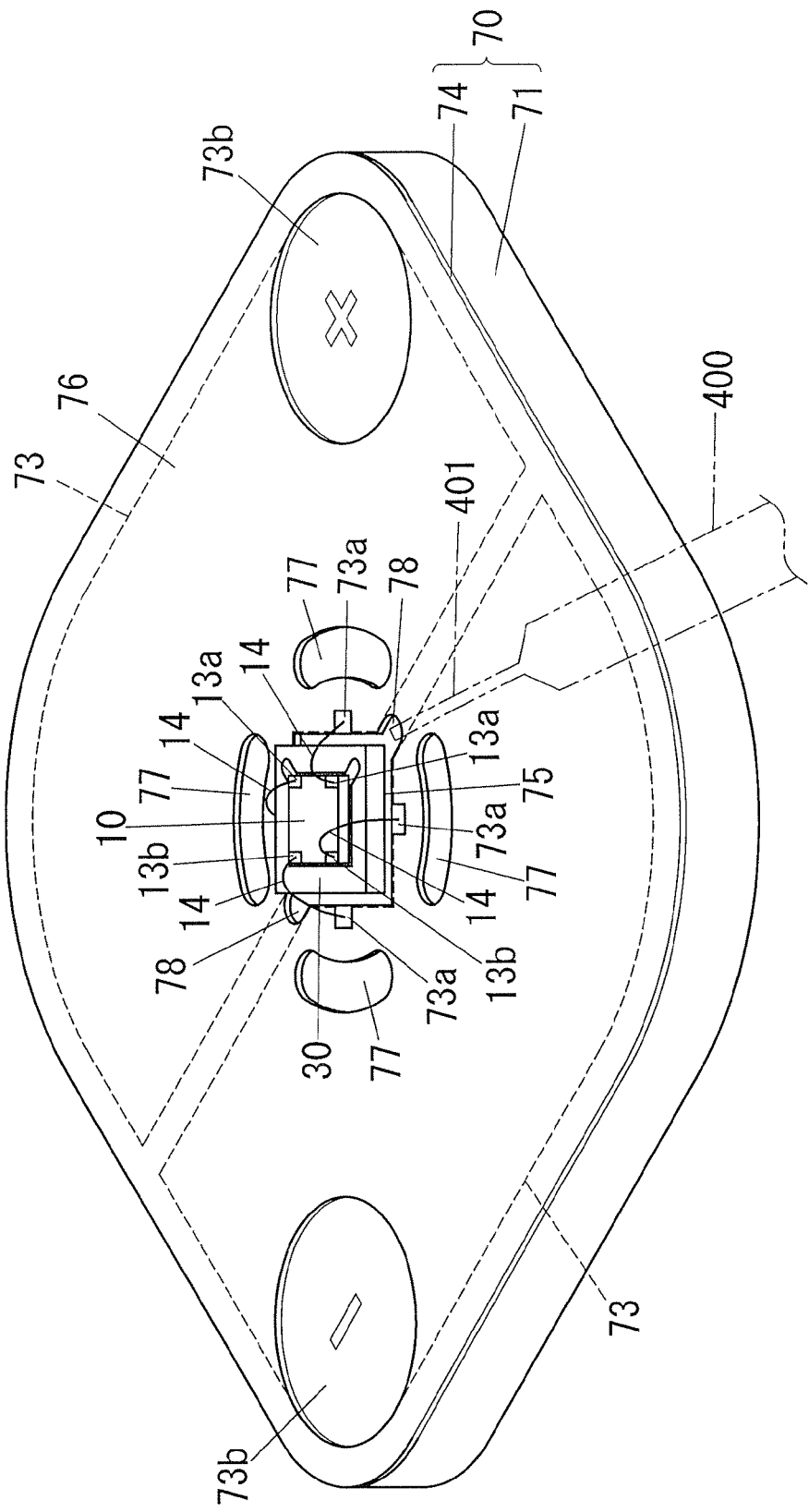
FIG. 7 is a view illustrating a method for manufacturing the light-emitting device of FIG. 5.

Meanwhile, as to a method for manufacturing the above described light-emitting device 1, for example, conceivable is a method in which the LED chip 10 and each of the conductor patterns 73, 73 are electrically connected to each other via two bonding wires 14, respectively, and after that, as shown in FIG. 7, a tip of a nozzle 401 of a dispenser 400 is positioned in a resin injection hole 78 formed in communication with the window hole 75 in the wiring board 74, and then a liquid encapsulation resin (for example, a silicone resin) is injected into a gap between the sub-mount member 30 and the wiring board 74, and is cured to form a part of the sealing part 150, and the liquid encapsulation resin (for example, a silicone resin) to be the remaining part of the sealing part 150 is injected again into the dome-shaped optical member 160 and the optical member 160 is arranged at a predetermined position on the chip mounting member 70, and then the encapsulation resin is cured to from the sealing part 150 and to fix the optical member 160 to the chip mounting member 70 at the same time, and then the color converting member 170 is fixedly attached to the chip mounting member 70. In such a manufacturing method, since air bubbles (voids) may be formed in the sealing part 150 during the manufacturing process, it is necessary to inject an excess amount of the liquid encapsulation resin into the optical member 160. However, if such a method is adopted, when the optical member 160 is arranged at a predetermined position on the chip mounting member 70, a part of the liquid encapsulation resin overflows out of the space surrounded by the optical member 160 and the chip mounting member 70 and spreads over the surface of the resist layer 76, which forms an unnecessary encapsulation resin part, whereby light may be absorbed or diffused reflection of light may be caused due to the uneven surface thereof, and the light output efficiency of the light-emitting device 1 as a whole may be reduced.

Thus, in the light-emitting device 1 of this embodiment, a plurality of resin reservoir holes 77 for reserving the encapsulation resin overflowed from the space surrounded by the optical member 160 and the chip mounting member 70 are formed separately in the outer peripheral direction of the cal member 160 on the surface of the chip mounting member 70 between a portion on which a ring-shaped end of the optical member 160 is overlapped and a portion on which a ring-shaped end of the color converting member 170 is overlapped. The resin reservoir hole 77 is comprised with a through hole 77a formed in the wiring board 74 and a recess 77b formed in the conductive plate 71 at a position corresponding to the through hole 77a. Furthermore, in the light-emitting device 1 of this embodiment, a ring-shaped light absorption prevention substrate 40 is disposed on the surface of the chip mounting member 70 between the portion on which the ring-shaped end of the optical member 160 is overlapped and the portion on which the ring-shaped end of the color converting member 170 is overlapped to cover each of the resin reservoir holes 77, and the light absorption by the resin part which is formed by the encapsulation resin reserved and cured in each of the resin reservoir holes 77 can be prevented by the light absorption prevention substrate 40. In the light absorption prevention substrate 40, a white resist layer for reflecting the light from the LED chip 10, the color converting member 170 and so on is provided on the surface opposite to the chip mounting member 70 side, whereby the above described light absorption can be prevented. The light absorption prevention substrate 40 may be disposed on the surface side of the chip mounting member 70 after the encapsulation resin which overflows when the optical member 160 is arranged at a predetermined position on the chip mounting member 70 fills each of the resin reservoir holes 77, and then it may be fixed to the chip mounting member 70 by the encapsulation resin when the encapsulation resin is cured. In the light absorption prevention substrate 40, a plurality of cutouts 42 for exposing a small region of each of the resin reservoir holes 77 are formed to prevent that voids are generated when the encapsulation resin in the resin reservoir holes 77 is cured.

In the light-emitting device 1 of this embodiment, as is the case with the first embodiment, the sheet-shaped connecting member 80 disposed on the other surface side of the conductive plate 71 for connecting the conductive plate 71 to the body 90 of the luminaire which is a metal member for holding the chip mounting member 70 and having an electrical insulating property and thermally connecting the conductive plate 71 and the body 90 to each other is provided. So, as compared with the case where a rubber sheet-shaped heat radiation sheet is disposed between the body 90 and the plate, it is possible to reduce the heat resistance from the light-emitting part of the LED chip 10 to the metal member for holding the chip mounting member, whereby the heat radiation property can be enhanced, variation of the heat resistances can be reduced, and a rise of a junction temperature of the LED chip can be constrained. Therefore, it is possible to increase the input power and to increase the power of the light output.

In addition, in the light-emitting device 1 of this embodiment, the connecting member 80 has a plane size larger than that of the conductive plate 71. So, as compared with a case where the connecting member 80 and the conductive plate 71 are formed to have the same plane size, it is possible to lengthen a creepage distance between the conductive plate 71 and the body 90 of the luminaire which is a metal member, so that it is possible to enhance a lighting surge protection when the device is used as a light source of a luminaire (it is noted that an indoor luminaire and an outdoor luminaire generally require different creepage distances between a light-emitting device and a metal member, and an outdoor luminaire requires a longer creepage distance). As to the thickness of the sheet-shaped connecting member 80, it is necessary to design the thickness depending on a withstanding pressure which is required for lighting surge protection, but a smaller thickness is desirable in terms of a lower heat resistance. Therefore, as to the connecting member 80, the plane size may be set to satisfy the requirement of the creepage distance after the thickness of the connecting member 80 is set.

Figure 10:
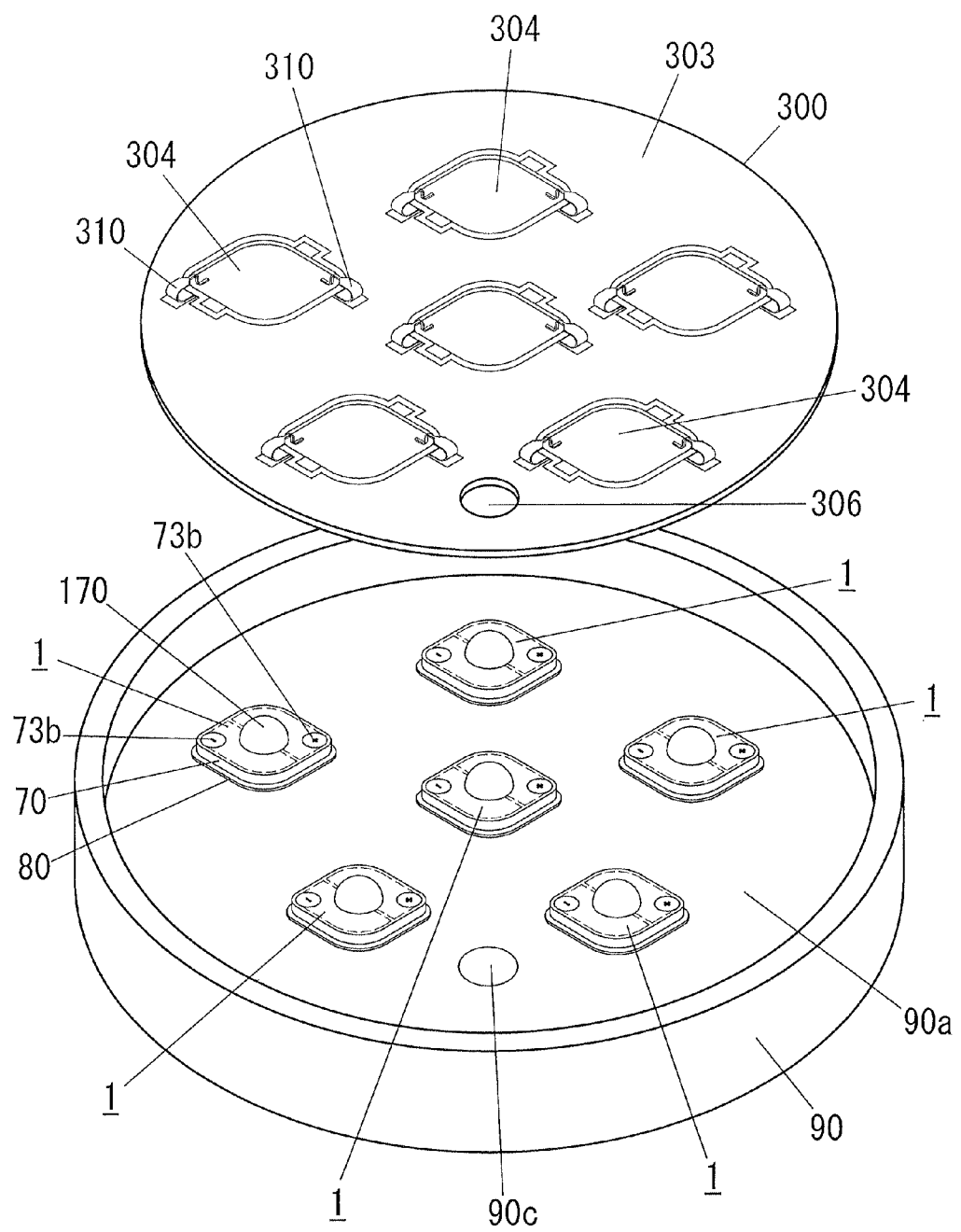
FIG. 10 is a schematic exploded perspective view showing main sections of a luminaire which uses the light-emitting device of FIG. 5.
Figure 11:
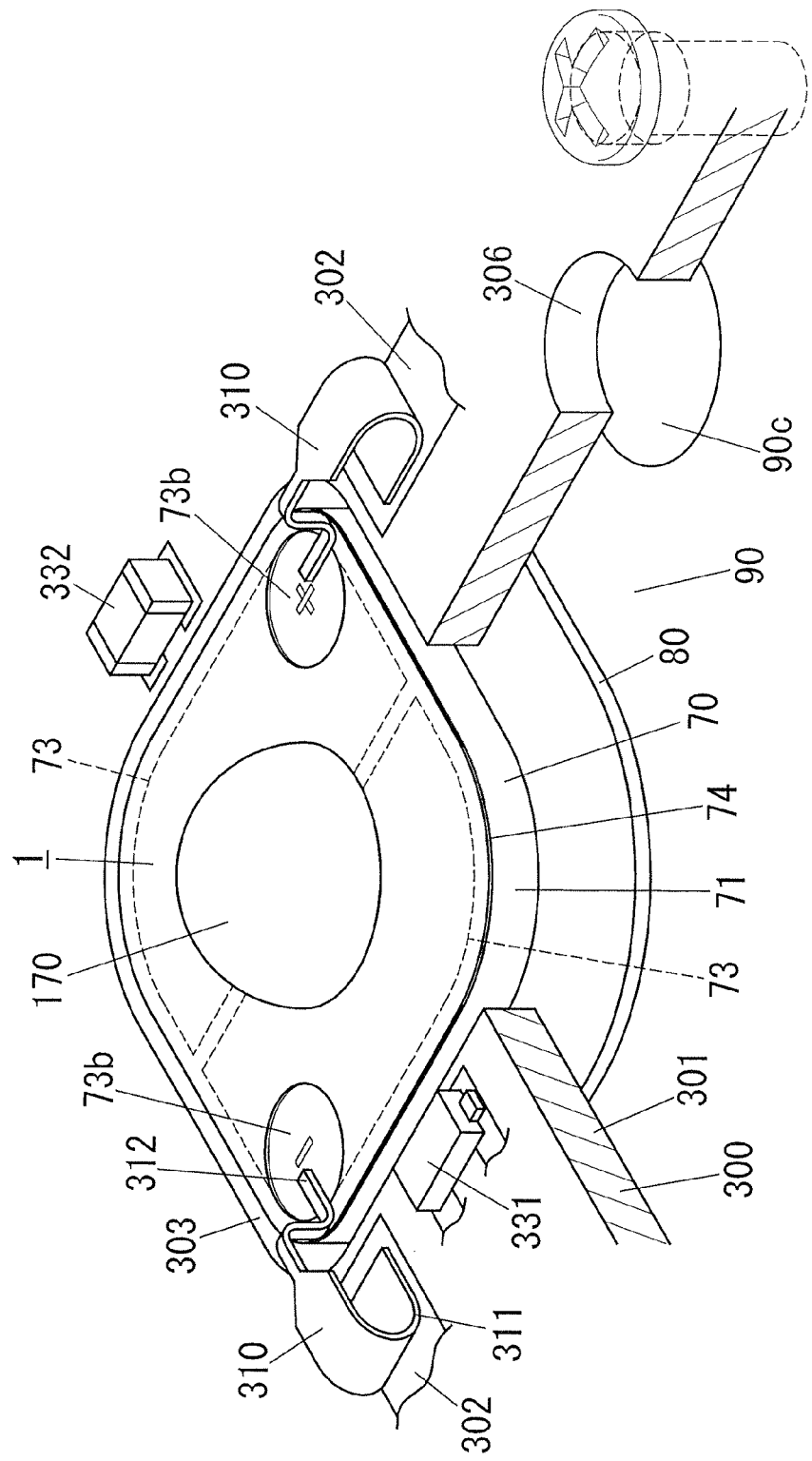
FIG. 11 is a schematic perspective view showing main sections of a luminaire which uses the light-emitting device of FIG. 5.
Figure 12:
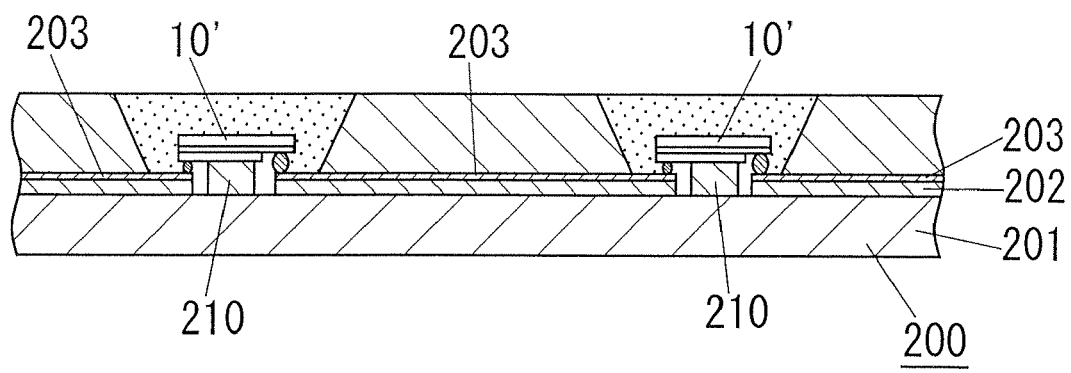
FIG. 12 is a schematic cross-sectional view of a light-emitting device (LED unit) in the prior art.

In the luminaire described in the first embodiment, each of the light-emitting devices 1 is connected by means of the leads 93 (see FIG. 1 and FIG. 4), but in the luminaire of this embodiment, as shown in FIG. 10 and FIG. 11, a circuit board 300 including an insulating substrate 301 on which a wiring pattern 302 is formed on one surface thereof for defining the connection between the light-emitting devices 1 is provided. In this embodiment, a plurality of light-emitting devices 1 are connected in series, but the connection type of the light-emitting devices 1 is not particularly limited to that. For example, the light-emitting devices 1 may be connected in parallel, or a series connection and a parallel connection may be combined.

The circuit board 300 is disposed separately from the bottom wall 90a of the body 90 in the luminaire, and has opening windows 304 formed in positions thereof corresponding to the light-emitting devices 1 for inserting a part of the light-emitting device 1, respectively. The insulating substrate 301 of the circuit board 300 may be made of a glass epoxy resin such as FR4, but the material is not limited to the glass epoxy resin, and may be a polyimide-based resin or a phenolic resin for example.

The above described circuit board 300 has a wire insertion hole 306 which is formed therethrough for inserting leads for power supply which are inserted through the insertion hole 90c formed through the bottom wall 90a of the body 90, and a pair of wires inserted through the wire insertion hole 306 is electrically connected to the circuit board 300. The circuit board 300 further has a light reflecting layer 303, which is a white resist layer, formed on a surface side opposite to the bottom wall 90a of the body 90 side, and the most part of the wiring pattern 302 is covered with the light reflecting layer 303.

In the circuit board 300, each opening window 304 has a plane size which is slightly larger than that of the chip mounting member 70 of the light-emitting device 1. In the light-emitting device 1 of the present embodiment, the chip mounting member 70 has chamfered parts at the four corners in a plan view to round the corners, and as compared with the two chamfered parts near the electrode sections 73b (the right and left chamfered parts in FIG. 7), the remaining two chamfered parts (the top and bottom chamfered parts in FIG. 7) are designed to have a larger radius curvature. So, it is possible to increase a region area in which the wiring pattern 302 can be formed on the surface of the circuit board 300. The circuit board 300 is provided with a surface-mounted Zener diode 331 for over voltage protection (see FIG. 11) and a surface-mounted ceramic capacitor 332 (see FIG. 11) near each of the opening windows 304 in order to prevent an application of an over voltage to the LED chip 10 of the light-emitting device 1.

In the light-emitting device 1 of the present embodiment, each electrode section 73b of the chip mounting member 70 is electrically connected to the wiring pattern 302 of the circuit board 300 via the terminal plate 310. The terminal plate 310 is folded at one end of the elongated metal plate into an L shape to form a terminal strip 311 which is connected to the wiring pattern 302 in such a way that the terminal strip 311 overlaps the wiring pattern 302 in the thickness direction, and the terminal plate 310 is folded at the other end thereof into a J shape to form a terminal strip 312 which is connected to the electrode section 73b in such a way that the terminal strip 312 is fixed to the electrode section 73b in the thickness direction. Therefore, it is possible to relieve the stress applied to connection parts between the connecting terminal 310 and the electrode section 73b and between the connecting terminal 310 and the wiring pattern 302 due to a difference in linear expansion coefficient between the body 90 and the circuit board 300, thereby it is possible to increase the connection reliability between each light-emitting device 1 and the circuit board 300.

In the above described Embodiments, each of the light-emitting devices 1 is provided with the connecting member 80, but the connecting member 80 may have a larger plane size, and a plurality of light-emitting devices 1 may commonly use the connecting member 80.

The invention claimed is:

1. A light-emitting device comprising:
   a LED chip;
   a chip mounting member having a heat transfer plate and a conductor pattern: said heat transfer plate being made of a heat conductive material and one surface side of which said LED chip is mounted on, said conductor pattern being formed on the one surface side of said heat transfer plate through an insulating part and electrically connected to said LED chip;
   a sheet-shaped connecting member disposed on the other surface side of said heat transfer plate to connect said heat transfer plate to a metal member for holding said chip mounting member, said connecting member having an electrical insulating property and connecting said heat transfer plate and said metal member thermally to each other;
   a sealing part which is made of an encapsulation resin and seals the LED chip;
   an optical member which has a convex light output surface and is piled on the sealing part; and
   a dome-shaped color converting member which is a molding made of a translucent material and a phosphor, the phosphor emitting a light having a color different from an emission color of the LED chip when excited by the light emitted from the LED chip, the color converting member covering the optical member from the light output surface side of the optical member, the color converting member being arranged so that an air layer is formed between the light output surface and the color converting member,
   wherein said connecting member is made of an epoxy resin sheet which includes a filler and whose viscosity is reduced by heating, and
   wherein said epoxy resin sheet has a high flowability in heating.

2. The light-emitting device as set forth in claim 1, wherein said LED chip has a light-emitting part made of a GaN-based compound semiconductor material on a main surface side of a conductive substrate formed from a SiC substrate or a GaN substrate.

3. The light-emitting device as set forth in claim 1, further comprises a sub-mount member which is larger in chip size than said LED chip and is disposed between said LED chip and said heat transfer plate to relieve a stress applied to said LED chip due to a difference in linear expansion coefficient between said LED chip and said heat transfer plate.

4. The light-emitting device as set forth in claim 1, wherein said connecting member has a plane size larger than that of said heat transfer plate.

* * * * *